(12) United States Patent
Sherlekar et al.

(10) Patent No.: US 7,989,849 B2
(45) Date of Patent: Aug. 2, 2011

(54) APPARATUSES AND METHODS FOR EFFICIENT POWER RAIL STRUCTURES FOR CELL LIBRARIES

(75) Inventors: Deepak Sherlekar, Cupertino, CA (US); Darrell Heinecke, Richfield, MN (US); Eswar Veluri, Millburn, NJ (US)

(73) Assignee: Synopsys, Inc., Mountain View, CA (US)

( * ) Notice: Subject to any disclaimer, the term of this patent is extended or adjusted under 35 U.S.C. 154(b) by 701 days.

(21) Appl. No.: 11/870,330

(22) Filed: Oct. 10, 2007

(65) Prior Publication Data

US 2008/0111158 A1 May 15, 2008

Related U.S. Application Data

(60) Provisional application No. 60/859,307, filed on Nov. 15, 2006.

(51) Int. Cl.
*H01L 27/10* (2006.01)
(52) U.S. Cl. .................. 257/207; 257/204; 257/E27.01; 716/126
(58) Field of Classification Search .................. 257/207, 257/E27.01, 672, 204
See application file for complete search history.

(56) References Cited

U.S. PATENT DOCUMENTS

| | | | |
|---|---|---|---|
| 5,468,977 A | 11/1995 | Machida |
| 5,723,883 A | 3/1998 | Gheewalla |
| 5,740,102 A | 4/1998 | Kawashima |
| 5,742,542 A | 4/1998 | Lin et al. |
| 5,763,907 A | 6/1998 | Dallavalle et al. |
| 5,898,194 A | 4/1999 | Gheewala |
| 5,917,228 A | 6/1999 | Matsuda et al. |
| 5,923,059 A | 7/1999 | Gheewala |
| 5,923,060 A | 7/1999 | Gheewala |
| 5,981,987 A | 11/1999 | Brunolli et al. |
| 6,091,090 A | 7/2000 | Gheewala |
| 6,140,686 A | 10/2000 | Mizuno et al. |
| 6,184,726 B1 | 2/2001 | Haeberli et al. |
| 6,194,915 B1 | 2/2001 | Nakayama et al. |
| 6,249,471 B1 | 6/2001 | Roy |
| 6,306,744 B1 | 10/2001 | Aldrich |
| 6,307,272 B1 | 10/2001 | Takahashi et al. |
| 6,308,307 B1 | 10/2001 | Cano et al. |
| 6,337,593 B1 | 1/2002 | Mizuno et al. |
| 6,340,825 B1 | 1/2002 | Shibata et al. |
| 6,380,798 B1 | 4/2002 | Mizuno et al. |
| 6,445,065 B1 | 9/2002 | Gheewala et al. |
| 6,448,631 B2 | 9/2002 | Gandhi et al. |

(Continued)

OTHER PUBLICATIONS

Knapp, Kevin "Proper Planning Assures SoC Power Integrity—At 90nm and below, avoiding IR drop and electromigration problems becomes a crucial aspect of SoC design", Dec. 2006/Jan. 2007 Issue of Chip Design Magazine, Internet download http://www.chipdesignmag.com/print.php?articleID=966?issueID=20, Apr. 27, 2007, 6 pages.
Non-Final Office Action for U.S. Appl. No. 10/779,194, mailed Apr. 5, 2006, 9 pages.
Non-Final Office Action for U.S. Appl. No. 10/779,194, mailed Sep. 13, 2006, 5 pages.

(Continued)

*Primary Examiner* — Thinh T Nguyen
(74) *Attorney, Agent, or Firm* — Fenwick & West LLP

(57) ABSTRACT

An integrated circuit has a power rail formed of a first wire in a lower metal layer and a second wire in an upper metal layer and that run in the same direction in their respective layers. A number of vias connect the first and second wires, to form a sandwich power rail structure. Other embodiments are also described and claimed.

20 Claims, 8 Drawing Sheets

U.S. PATENT DOCUMENTS

| | | |
|---|---|---|
| 6,462,978 B2 | 10/2002 | Shibata et al. |
| 6,538,945 B2 | 3/2003 | Takemura et al. |
| 6,611,943 B2 | 8/2003 | Shibata et al. |
| 6,617,621 B1 | 9/2003 | Gheewala et al. |
| 6,683,767 B2 | 1/2004 | Ito et al. |
| 6,838,713 B1 * | 1/2005 | Gheewala et al. ............ 257/211 |
| 6,842,375 B1 | 1/2005 | Raszka |
| 6,912,697 B2 | 6/2005 | Shibata et al. |
| 6,938,225 B2 | 8/2005 | Kundu |
| 6,941,258 B2 | 9/2005 | Van Heijningen et al. |
| 6,998,722 B2 | 2/2006 | Madurawe |
| 7,002,397 B2 | 2/2006 | Kubo et al. |
| 7,002,827 B1 | 2/2006 | Sabharwal et al. |
| 7,069,522 B1 | 6/2006 | Sluss et al. |
| 7,073,147 B2 | 7/2006 | Ikeda et al. |
| 7,129,562 B1 | 10/2006 | Gheewala et al. |
| 2002/0189910 A1 | 12/2002 | Yano et al. |
| 2003/0009730 A1 | 1/2003 | Chen et al. |
| 2003/0102904 A1 | 6/2003 | Mizuno et al. |
| 2006/0198228 A1 | 9/2006 | Sluss et al. |

OTHER PUBLICATIONS

Non-Final Office Action for U.S. Appl. No. 10/856,520, mailed May 23, 2005, 3 pages.

Non-Final Office Action for U.S. Appl. No. 10/856,520, mailed Aug. 8, 2005, 4 pages.

Non-Final Office Action for U.S. Appl. No. 10/856,520, mailed Oct. 26, 2005, 9 pages.

Non-Final Office Action for U.S. Appl. No. 10/856,520, mailed Jan. 10, 2006, 5 pages.

Non-Final Office Action for U.S. Appl. No. 11/401,806, mailed Jul. 24, 2008, 5 pages.

Non-Final Office Action for U.S. Appl. No. 11/401,806, mailed Oct. 21, 2008, 9 pages.

U.S. Appl. No. 10/779,194, filed Feb. 13, 2004, Inventor Sherlekar et al.

Virage Logic, "Speed Power, ASAP Standard Cell Libraries," Copyright 2002, Virage Logice Corporation, 4 pages.

Zyuban, V.V. et al., "Low Power Integrated Scan-Retention Mechanism," (OBM), ISPLED 2002, Aug. 12-14, 2002, pp. 1-8.

* cited by examiner

Violation: 3 neighboring vias need larger spacing 2 neighboring vias can be at minimum spacing Minimum spacing OK: vias have no parallel run length overlap Violation: Vias with parallel run length overlap need more spacing

APPARATUSES AND METHODS FOR EFFICIENT POWER RAIL STRUCTURES FOR CELL LIBRARIES

This application claims the benefit of the earlier filing date of the U.S. Provisional Application No. 60/859,307, filed Nov. 15, 2006.

NOTICE OF COPYRIGHT

A portion of the disclosure of this patent document contains material that is subject to copyright protection. The copyright owner has no objection to the facsimile reproduction by anyone of the example integrated circuit cell layout, as they appear in the Patent and Trademark Office Patent file or records, but otherwise reserves all copyright rights whatsoever.

BACKGROUND

An embodiment of the invention relates to the field of the electronic design automation, EDA/computer aided design, CAD of large scale integrated circuits (ICs), and particularly to laying out or routing power rail structures for a circuit cell that is used to design such integrated circuits. Other embodiments are also described.

Computer-aided cell-based design has been developed for quickly designing large scale ICs such as application specific integrated circuits (ASICs) and gate arrays. The cell is a circuit that has been pre-designed and pre-verified as a building block. Design technologies known as Standard Cell and Gate Array use different types of such building blocks, although the term "standard cell" as used here is intended to encompass both types. In a Standard Cell design, each distinct cell in a library may have unique geometries of active, gate, and metal levels. With Gate Arrays however, each cell shares the same basic building block, called a core cell that consists of fixed active and gate level geometries. Thus, different gate array cells are implemented using only metal interconnections between the active and gate elements of one or more core cells. Examples of a standard cell include a NAND gate, a NOR gate, a flip flop, and other similar logic circuits. A designer may select particular cells from a library of cells and insert them into a design. The library includes cells that have been designed for a given IC manufacturing process (e.g., complementary metal oxide semiconductor, CMOS, fabrication). The cells generally do not change from one design to the next, but the way in which they are interconnected will, to achieve the desired function in a given design. By being able to select the cells from the library and simply place them into the design, the designer can quickly implement the function without having to custom design the cells. He will thus have a certain level of confidence that the function will likely work as intended, when the integrated is actually manufactured, without having to worry about the details of the individual transistors that make up each cell.

The routing layers, such as metal layers, used in IC design have various routing elements such as wire (or line) and via elements. These perform at least two functions: they connect individual transistors to make up a cell, including supplying power to the cell, and they connect cells to each other globally to implement the desired function of the integrated circuit. The EDA/CAD software takes a design netlist of interconnected cells, and automatically places cells and routes the connections between them on a typical, square grid that overlays a region of the IC die (to be manufactured). The placement and routing of the netlist components has to comply with certain design rules, so that inevitable manufacturing process variations in the IC die can be tolerated.

SUMMARY

Various apparatus and methods are described for routing on an integrated circuit. In an embodiment, the standard cells in a cell based integrated circuit have a power rail formed of a first wire in a lower metal layer and a second wire in an upper metal layer and that run in the same direction in their respective layers. A number of vias connect the first and second wires at intervals of regulated spacing between each via in the number of vias, to form a sandwich power rail structure.

BRIEF DESCRIPTION OF THE DRAWINGS

While the design is subject to various modifications and alternative forms, specific embodiments thereof have been shown by way of example in the drawings and will herein be described in detail. The design should be understood to not be limited to the particular forms disclosed, but on the contrary, the intention is to cover all modifications, equivalents, and alternatives falling within the spirit and scope of the design.

DETAILED DISCUSSION

Figure 1:
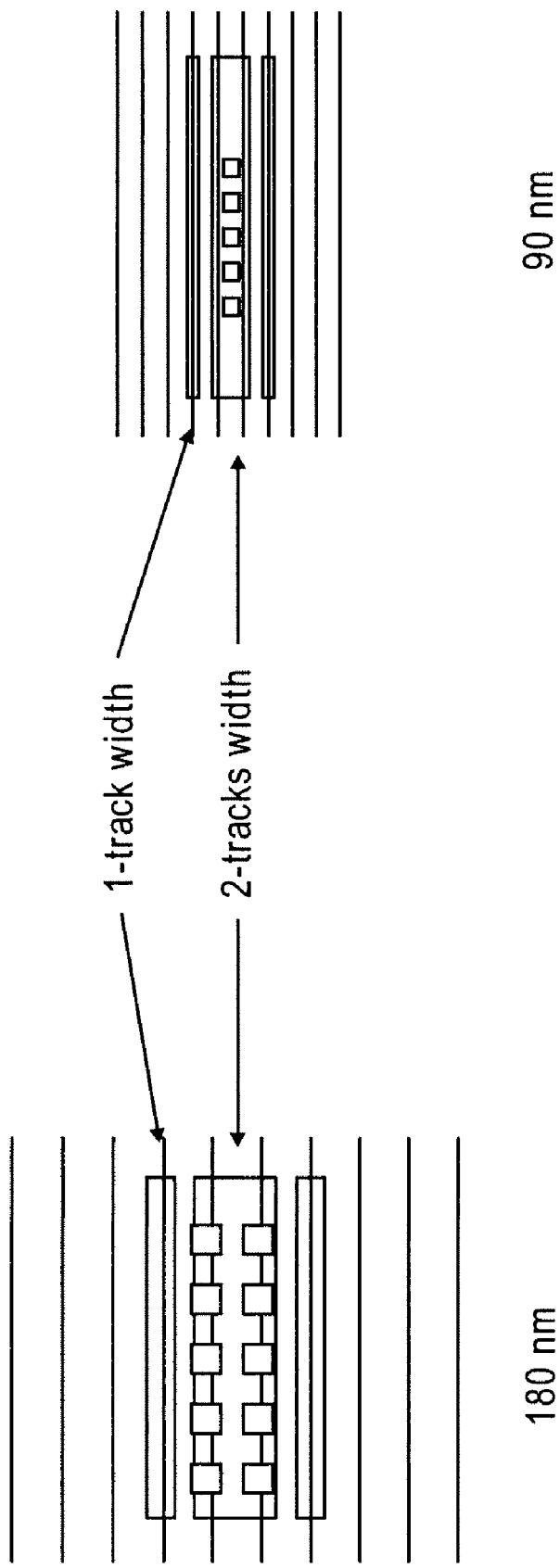
FIG. 1 illustrates, using an example, how the Wire Spacing Rule affects an integrated circuit layout design.

The following drawings and text describe several embodiments of the invention as different implementations of a logic platform design that has efficient power rail structures for standard cell libraries. These power rail structures are particularly suitable for nanometer fabrication processes that have ever shrinking device geometries, and may enable a reduction in the usage of the upper metal layer (e.g., the metal layer 2, or M2) within the cell.

In the following description, numerous specific details are set forth, such as examples of specific data signals, named components, connections, types of power gating designs, etc., in order to provide a thorough understanding of the present design. It will be apparent, however, to one skilled in the art that the present design may be practiced without these specific details. In other instances, well known components or methods have not been described in detail but rather in a block diagram in order to avoid unnecessarily obscuring the present design. Thus, the specific details set forth are merely exemplary. The specific details may be varied from and still be contemplated to be within the spirit and scope of the present design.

Various aspects of the design fall into the field of electronic design, including very large scale integration (VLSI) of circuits onto a micro electronic chip or die, by an integrated circuit (IC) designer. An aspect particularly relates to the layout or routing of power rails in cell-based integrated circuits, such as standard cell or gate-array based designs. In such designs a grid of routing tracks may be superimposed over a microelectronic chip, e.g. a chip made of silicon and/or other semiconductor materials, for the purpose of laying out individual components such as cells that eventually make up the functionality that is embedded or integrated into the chip.

The term "standard cell" may be defined as a circuit unit or circuit element that is provided, as part of a cell library of many different types of circuit units, to an integrated circuit designer; the standard cell is re-used in multiple instances as needed to make up the integrated circuit; e.g., a standard cell can be a base cell used in a gate array, or it can be a macro cell in a standard cell ASIC.

The term "power rail" may be defined as a wire structure that is primarily used to either supply power to (e.g., at a potential labeled Vcc/Vdd) or return power from (e.g., at a potential labeled ground or Vss) the elements that make up an integrated circuit such as a System-on-a-Chip. For example, the power rail may be formed by wires run in the same direction on a lower metal layer and a higher metal layer that are connected by a plurality of vias at intervals of regulated spacing between each via in the plurality of vias.

One concern of the IC designer is to route power supply and power return structures (collectively referred to here as "power rails") efficiently, to balance several factors including the height and spread of the design in the IC die. Power rails can be routed on the metal layer closest to the substrate of the die, namely metal layer 1 (M1). These are wire traces (wires or, simply, lines) that are primarily used to deliver power, rather than signals. M1 can be predominantly routed in the so-called "horizontal" or X-axis direction, i.e. the traces in that layer are, for the most part, oriented in the horizontal direction (as viewed from the bottom or from the top of the chip). The next metal layer above M1, namely metal layer 2 (M2) has been used sparingly in cell layout, i.e. interconnecting components within a cell, and instead has been predominantly used for chip level routing, i.e. between cells. M2 can be routed in the vertical or Y-axis direction. This routing scheme is called HVH, where routing directions for subsequent metal layers alternate, with M3 being horizontal, M4 vertical, and so on. In another routing scheme, M2 is routed predominantly in the horizontal direction for chip level routing, but is used sparingly for cell layout—it is called NXT.

Large scale ICs such as systems on a chip (SoC) have been developed using advanced IC manufacturing technologies with ever shrinking device geometries. As the geometries shrink in these submicron or "nanometer" fabrication processes (that produce devices having effective gate lengths of less than 100 nm), wider power rails are needed, which reduces the available space for routing signals. The design of robust power rails is further exacerbated by the following design rule, referred to as the Wide Wire Spacing Rule: as a wire or line becomes wider, a larger spacing is needed between that wire and an adjacent one (that is running in the same direction and in the same layer). See FIG. 1 for an illustration. Thus, a standard, 2-track wide wire, i.e. one that blocks two adjacent tracks (in the same layer) of the grid along which it runs, and thus prevents another wire (in the same layer) from being routed on either of those tracks and along side it, needs to be narrower in a 90 nanometer (nm) process than in a 180 nm process. This limits such a wire to support a single row of vias as shown in FIG. 1, whereas in the larger geometry processes, two rows of vias are supported by the single wire.

Also, note how the term "track" is used to define the width of a wire. For example, a 1-track M1 line and 1-track M2 line need not have exactly the same width measurement (e.g., the M1 line could be 0.26 microns wide, while the M2 line could be 0.2 micros wide, yet they are both "1-track" wires because each blocks a single track along which it runs).

Figure 2:
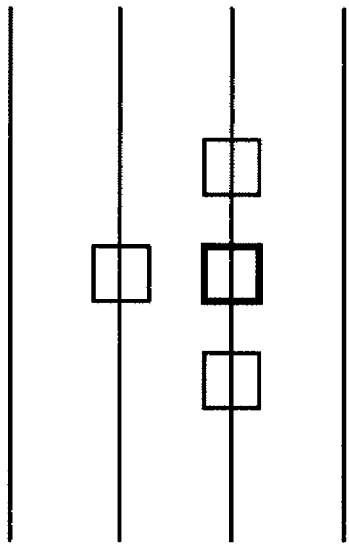
FIG. 2 shows an effect of the Via Farm Spacing Rule.
Figure 2:
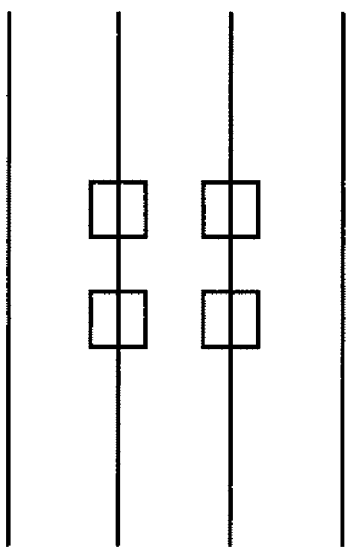

Another rule that renders routing difficult in submicron designs is the Via Farm Spacing Rule. Referring now to FIG. 2, this rule calls for larger via spacings (the shortest distance between two adjacent vias) when there are "many" vias in the vicinity (in the example here, four vias). This rule adversely impacts the ability of a signal router (an IC layout tool used by the IC designer) to connect to pins on cells that are placed under power straps. A power strap is a wire or trace used for distributing power and that is substantially orthogonal to a power rail. Here, it is instructive to note an additional consideration that affects M2 rail structure cell libraries and that has to do with reliability. In order to make reliable the connections from M2 rails to the active features of a cell, double cut vias have been recommended to be used in the cell layout. When combined with similar features in adjacent cells that are in rows above and below the cell, such connections reduce the vertical M1 porosity through the cell, making vertical chip level M1 routing (i.e., routing M1 wires between cells) less effective.

Figure 3:
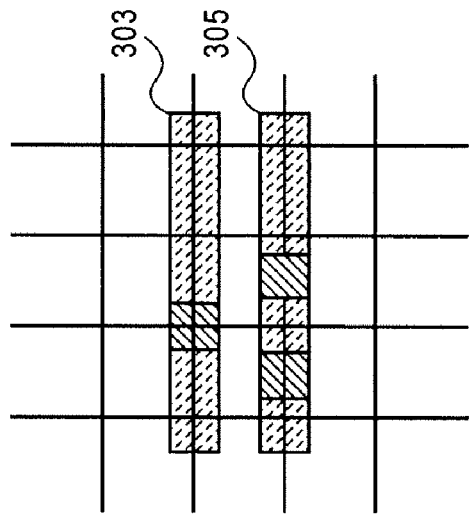
FIG. 3 illustrates an effect of the Different-Net Via Spacing Rule.
Figure 3:
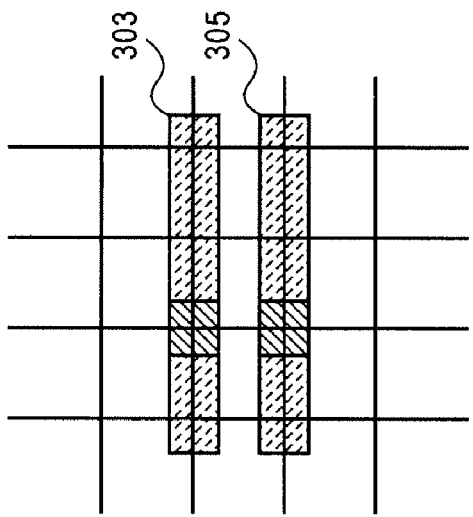

Another constraint on vias is the Different Net Via Spacing Rule. Referring to FIG. 3, this rule requires a larger spacing between vias that are on different "nets" 303, 305 (wire runs that correspond to different connections), when the vias have a parallel run length overlap. For instance, in VHV or HHV libraries, connections from M2 cell rails to active components in the cell use vias which may prevent routes on M2 tracks that are adjacent to the rail from dropping a via to connect to a cell pin on M1. In HVH libraries, via arrays connecting cell rails to the chip power grid prevent routing of vias on tracks adjacent to the rails. Dropping vias on adjacent grid points to connect to pins on adjacent tracks is also not possible.

A narrower M1-M2 sandwich rail, centered at the track that marks the cell boundary, replaces a conventional, single, wider M2 rail. For example, a 1-track wide M1 line connected to a 1-track wide M2 line sandwich rail may be used, instead of a single, 2-tracks wide M2 rail. This is implemented in the example 7 grids tall cell architecture in FIGS. 4 and 5. For taller cell architectures that might have used wider, single M2 rails, the M1 line's width may be made as wide as possible as long as reducing M1 resources does not impair cell layout. With rails that have odd track width M2 lines, the top and bottom cell boundaries line up with horizontal routing tracks on the chip. With even track width M2 rails, the top and bottom cell boundaries are offset by a half track relative to the horizontal routing tracks on the chip. See FIG. 6, which shows such an even track width M2 rail. In this embodiment, the cell boundary may be drawn midway between the two horizontal tracks occupied by the M2 rail. The VDD (respectively VSS) rails of cells in one row coincide with the corresponding VDD (respectively VSS) rails of cells in the adjacent row. The way the cell boundary is drawn, exactly one half the rail width juts out of the cell boundary. Drawing the cell boundary this way ensures that the rails of cells that are in adjacent rows will coincide in this manner. This also prevents double counting the contribution of the rail width to the height of a cell. Thus, the cell boundary may be deemed the longitudinal center line of the M2 and/or M1 line, of the sandwich rail. The power rail formed at the edge of the cell boundary may be shared by adjacent cells reducing the need for each row of cells to have its own dedicated power rail.

Figure 4:
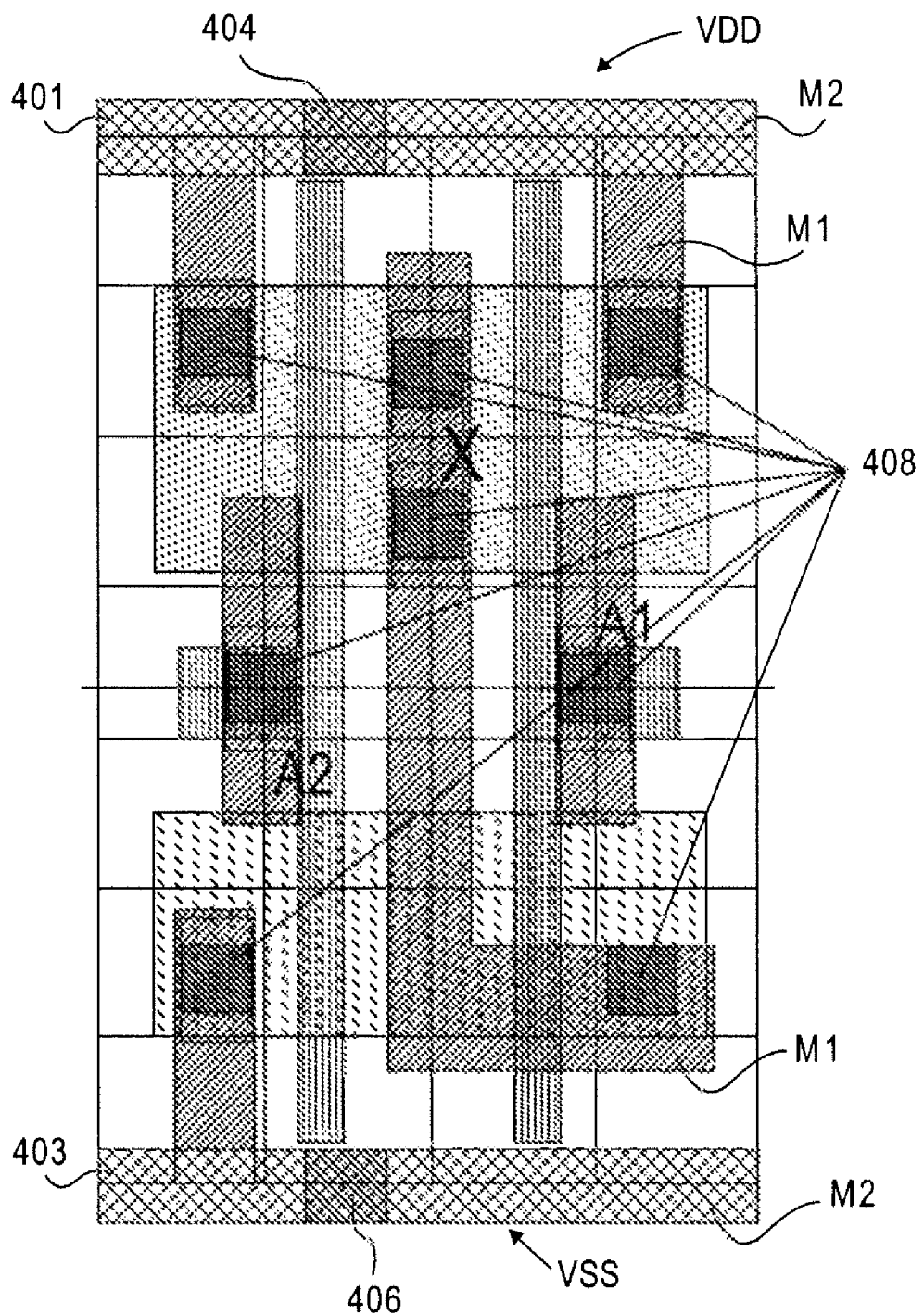
FIG. 4 shows an integrated circuit standard cell layout of an example NAND gate, in accordance with an embodiment.
Figure 5:
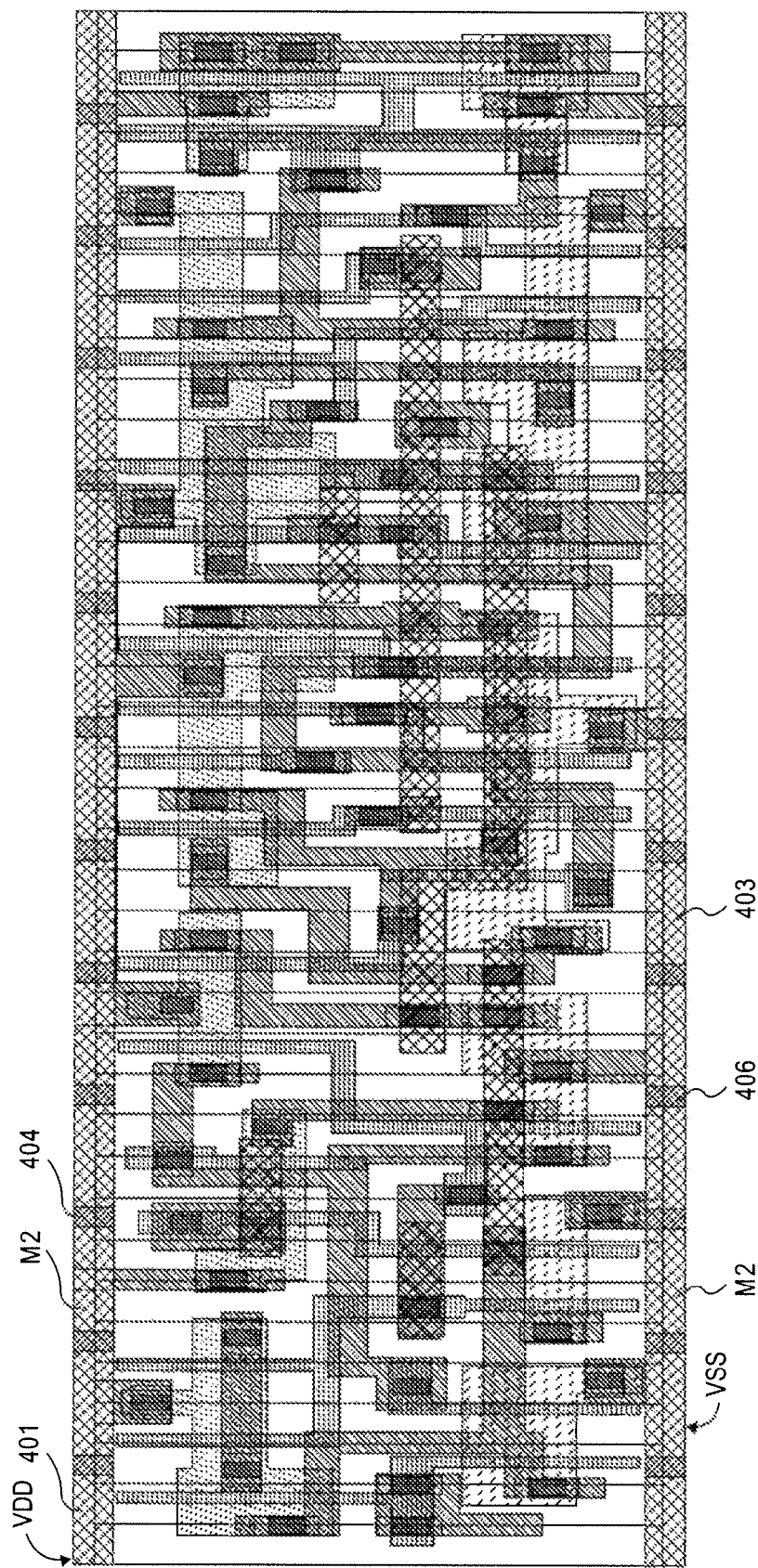
FIG. 5 shows the layout of an example standard cell flip-flop, in accordance with an embodiment.
Figure 6:
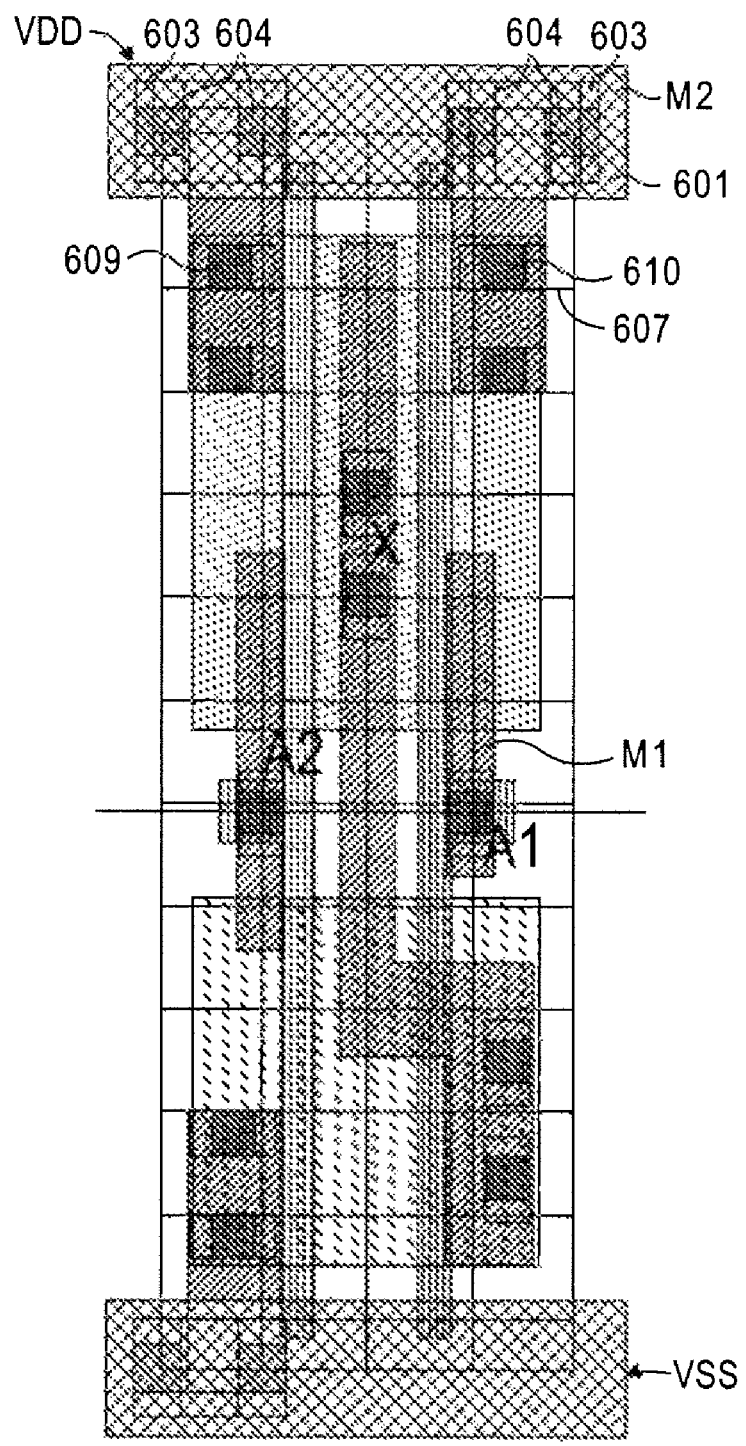
FIG. 6 shows the layout of an example NAND gate using a taller architecture, in accordance with another embodiment.
Figure 7:
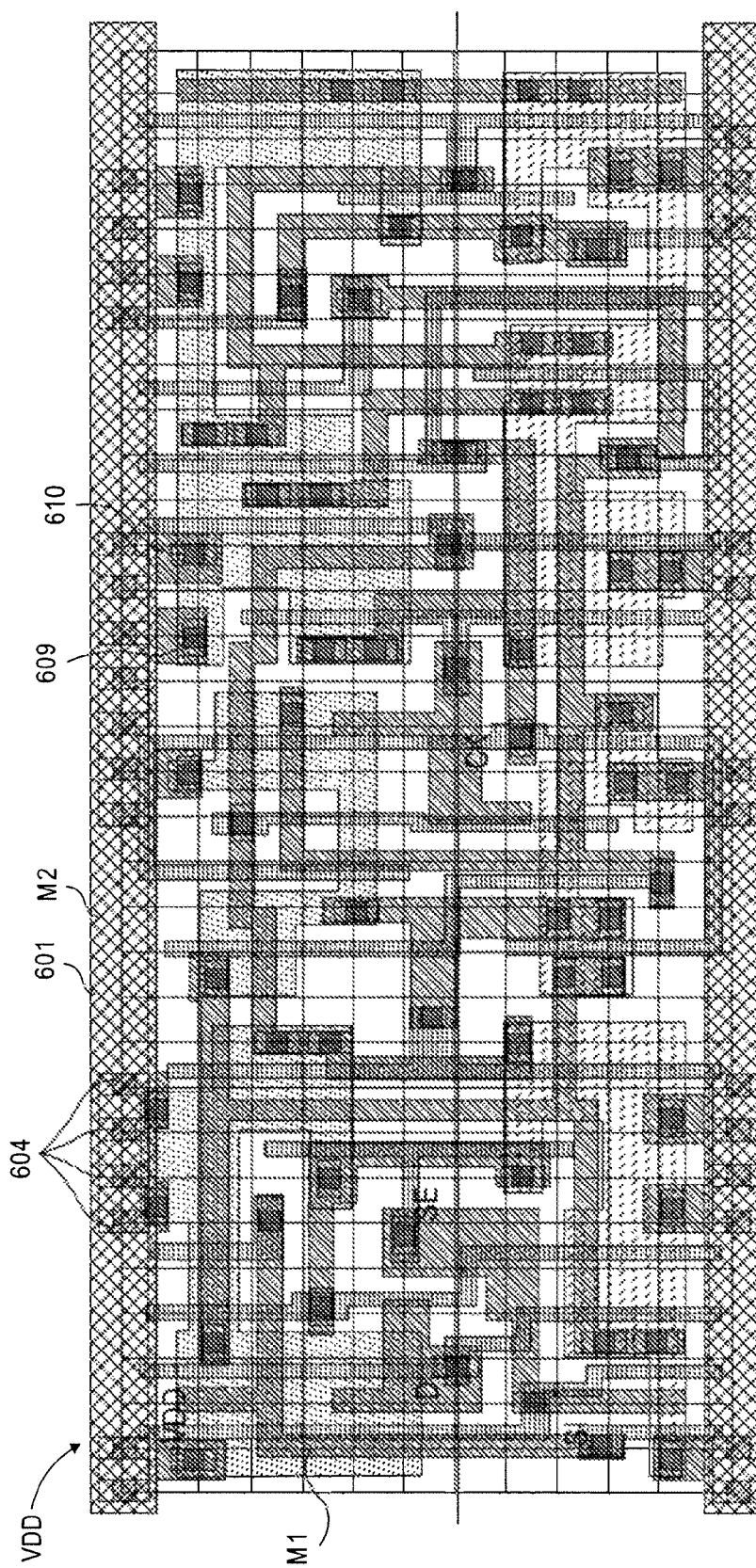
FIG. 7 shows the layout of an example flip-flop using a taller architecture, in accordance with another embodiment.

FIG. 4 illustrates an embodiment of routing power rails at the cell level, for a cell layout architecture that supports an on-track routing regime where the majority of chip level wires are routed with their centers, on-track. The integrated circuit layout design may be viewed as building upon the NXT routing architecture with a new, robust and efficient structure for routing power rails in the presence of the above design rules and at nanometer device geometries. The design is described with example cell architectures, one of which is 7 grids tall (FIG. 4 and FIG. 5, and another that is 12 grids tall (FIG. 6 and FIG. 7).

FIG. 4 illustrates the layout of a 2-input NAND gate. Power rails VDD and VSS are each one track wide and run in the same direction (here, horizontal or X-direction) on M1 and M2 routing layers, with vias 404, 406 connecting between the two lines of the rails, respectively, to create sandwich power rails between the two metal layers. Note FIG. 4 is only a top view, showing the M2 layer of the power rails, it being understood that the M1 line of each structure is located directly underneath its associated or respective M2 layer line. In other words, the VDD rail is composed of an M2 line 401 connected to an associated M1 line (not shown), by at least the via 404. Similarly, the VSS rail is composed of an M2 line 403 connected to an associated M1 line directly beneath it (not shown), by at least the via 406. In this case, each of the lines 401, 403 continuously run the entire width of the cell (in the X-Y plane) and are connected to each other by a number of vias 404, 406. These are sufficient in number so as to obtain a sufficiently low resistance in the power rail. Also, note the location of the lines 401, 403 namely along the top and bottom cell boundary lines, respectively. Vias 408 are within the cell and connect M1 to the semiconductor substrate layer below it. FIG. 5 illustrates this concept of the novel power rail structure, as applied to a D-type flip-flop with scan. In one embodiment, the new rail structure has the following features.

In cell architectures using the 1-track wide M1 connected to a 1-track wide M2 sandwich rails, the rails may be connected by vias that are at least 1 grid away from the left or right (here, vertical) cell boundary. Further, successive vias connecting the M1 and M2 lines of the rail should be spaced at least 3 grids apart in the direction that the power rail is routed. A "grid" or "pitch" is defined as the distance between a pair of adjacent horizontal or vertical routing tracks. These conditions may ensure that even after accounting for the vias that are in the cells of an adjacent, flipped and abutting row, there are at most 2 vias every 3 grids on the cell rail. This condition of spacing the vias of the power rail by three (3) successive routing trace grids (as seen in FIG. 5) ensures that a signal via on a track that is next to a rail will not cause the Via-Farm Rule spacing violation illustrated in FIG. 2. Further, all of the vias that connect the M1 and M2 lines of a rail should be placed with their centers on the half grid relative to the main routing grid, i.e. each via is centered halfway between a respective pair of adjacent routing tacks that are orthogonal to the power rail, as seen in the example layout of FIG. 5. This arrangement may ensure that there is no parallel run length overlap between the vias that are in the rail and an on-grid via that may be dropped by the signal router on a track adjacent to the rail. As a result, the vias in the cell rail will not cause the Different Net Via Spacing violation illustrated in FIG. 3.

In accordance with another embodiment, single, 2-tracks wide M2 rails may be designed instead with an M1-M2 sandwich rail whose M1 line is "optional" for the IC designer. In other words, at the cell library level, space is reserved for the optional M1 line of the cell power rail, so that no design rule would be violated and no short circuit would occur, should the IC designer elect to include the optional M1 line while laying out the chip (at the chip level). FIGS. 6 and 7 are example layouts that use such a power rail structure. This scheme enables strengthening the M2 rail with the optional M1 rail.

FIG. 6 is the layout of an example "tall" 2-input NAND gate and FIG. 7 shows a "tall" D-type flip-flop with scan. The vias 604 connecting the M2 VDD rail 601 to M1 (603) of a VDD rail are placed at the cell boundary, so that their centers are at least one and a half grids away from the first available routing track 607 of the cell. Thus, they satisfy the larger Via Farm Spacing Rule, with respect to signal vias 609, 610 that are routed on the track 607. As a result, there are no constraints on the vias 604 used for connecting the M1 and M2 lines of the rail, compared to those vias needed for connecting 1-track rails (FIGS. 4 and 5), to meet the Via Farm Spacing Rule. In the absence of the optional M1 lines for the rails in this cell design, chip level routing can route M1 vertically to relieve congestion in designs that need more vertical routing resources. For designs that need more horizontal routing resources, M1 may be routed horizontally at the chip level, i.e. outside the cells, with or without the optional M1 line in the power rail of the cell design. Note that in the 12 tracks tall architecture illustrated in FIGS. 6 and 7, the M2 line 601 (of the optional M1 sandwich rail) is slightly wider than a 1 track wide line. The rail was made as wide as possible without having an impact on M1 resources available for internal cell routing. This arrangement also helps improve vertical M1 porosity across the cell boundary, which is useful when there is no M1 line used in the rail of a given cell and M1 is routed vertically. Note also that although the M2 line continuously runs the entire width of the cell, the optional M1 line need not, in this case, leave several gaps between M1 line segments.

The 1-track wide M1 connected to M2 sandwich rails, as well as the 2-track wide M2 rails with optional M1 sandwich rails, permit the M2 lines of the rails to be widened at the chip level (i.e., routing between cells), if required. Thus, a cell design with in effect a programmable-width power rail is possible. The 1-track M2 rails can be widened either above, or below, to create 2-tracks wide M2 rails Note, the M1 may be present in all of these cases, with a fixed width of 1 track. In practice, the M1 rail can also be made optional much like it is in the wider M2 rail architecture of FIG. 6 and FIG. 7. Having the M1 rail present helps shore up a relatively weak 1 track wide M2 rail in many applications of 65 nm and 45 nm libraries. A 1 track wide M2 rail may not be as weak in older (larger) geometries, so having an optional M1 rail with 1 track wide M2 rails in older geometries may be possible.

The sandwich rail can also be widened both above and below to create 3 tracks wide M2 rails. The two tracks wide M2 rails can be either widened in one direction to offset 3-tracks wide M2 rails, or widened both above and below to create 4 tracks wide M2 rails. Architectures with an optional M1 sandwich rail, such as the one with wider M2 rails in FIGS. 6 and 7, may benefit from higher routability with the optional M1 sandwich rail before considering wider M2 rails. In an embodiment, the width of the M1 rails need not change. Thus, for example, the higher metal layer wire may be two or more routing tracks wide, or a single routing track wide. Note also, in a 2 track wide power rail run on the higher metal layer, vias can connect down to a lower metal layer or to the silicon. These vias are centered between the two or more routing tracks that route the wires for the 2-track wide power rail.

The embodiment of routing or locating cell rail vias with their centers at the half-grid (see via 404 in FIG. 4 and in FIG. 5) is also beneficial to and can thus be used for routing at the chip level. If all vias on pre-routed nets, such as power and clock, are routed with their centers on the half-grid, they would have no parallel run length overlaps with on-grid vias on other nets. Thus, the larger Different-Net Via Spacing Rule would not be triggered, reducing the impact of pre-routed wiring on signal routing that follows it. At the chip level, routers could avoid violating the Different Net Via Spacing Rule by moving vias on a case-by-case basis to meet the larger spacing, thereby helping reduce the via failure rate. The new design described here proposes eliminating such conflicts between pre-routed nets and those routed later on, by shifting the vias in the pre-routed nets by a half grid.

In accordance with another embodiment, an IC layout architecture or methodology is defined with at least two classes of nets or routes. One class contains all of the pre-routed nets of a particular design, such as clocks and power lines, whose vias are mostly on the half-grid, while the other class contains all of the signal nets of the design, other than clock and power, whose vias are mostly on grid. In another embodiment, one class of nets contains those of the design that are on odd-numbered tracks, while the other class of nets contains those that are on even-numbered tracks. The use of pre-routed vias centered at the half grid reduces conflicts with subsequent signal routing, thus improving overall routability.

To explain further advantages of the half-grid concept in combination with the sandwich power rail, consider the following. Assume a design methodology in which any given rail is routed either on M1, or on M2, but not as a sandwich on both layers. The use of 1 track wide M2 rails may trigger a via farm spacing rule for vias on tracks adjacent to the rails when power rail vias in cells in one row interleave with those of cells in an adjacent row to create the situation depicted in FIG. 2. The use of 1 track wide M1 rails may result in a similar problem when a wide M2 or M4 power strap belonging to the chip power distribution grid connects to the M1 rail with a via array. In that case, a minimum 2-tracks rail width may need to be used to avoid via routing problems with the Via-Farm Spacing rule, thereby reducing available routing resources. All vias on the rail would be routed so that their centers coincide with that of the rail, and are 1.5 tracks away from the first available track adjacent to the rail, thus meeting the larger Via Farm Spacing Rule. A single M2 rail in the absence of a sandwich M1-M2 rail can make failures of vias that connect the single M2 rail down to M1 catastrophic. The M1-M2 sandwich permits narrower M2 rails, and does not suffer catastrophic failures if a via that connects the two rails fails Returning to FIG. 4 and FIG. 6, as mentioned above, these illustrate a 2-input NAND gate implemented with the proposed architecture in two different cell libraries—one 7 tracks tall, and one 12 tracks tall. The 7 tracks tall cell architecture (FIG. 4) has a 1-track M1-M2 sandwich rail. The 12 tracks tall cell architecture has a 2 tracks wide M2 rail with an optional M1 sandwich rail. FIG. 5 illustrates a D flip-flop with scan in the 7 grids tall cell library, and FIG. 7 in the 12 grids tall cell library. In the 7 tracks tall cells of FIGS. 4 and 5, the spacing between successive vias in the 1-track wide cell rails is 3 grids. Further, the center of the first via from the left or the right edge of a cell is exactly 1.5 grids. This ensures that after accounting for cells in a row of the cells that is flipped and abutted immediately above or below the one shown in the figures, there will be at most 2 vias on successive grids. Thus, the Via-Farm Rule may not be triggered, between vias in the rails and those on the first available track adjacent to the rail.

The above constraint on via placement is not necessary in the 12 tracks tall cell architecture (FIGS. 6 and 7), which has a 2-tracks wide M2 rail, since the vias will be 1.5 grids away from vias on tracks adjacent to the rails, which is sufficient to satisfy the larger via spacing. Unlike the 7 tracks tall cell architecture, the 12 tracks tall cell library uses 2-cut vias for connections from M2 to M1 in the rails. A vertical M1 landing pad for vias in the cell rails is chosen since it provides higher vertical M1 porosity without any adverse impact on M1 routing in the cell, and enables a wider M1 rail. This arrangement enables the architecture to support an optional M1-M2 sandwich rail. Thus when electromigration (EM) or other electrical considerations are met with the M2 rail alone, a design can permit the chip level router to route M1 in either horizontal or vertical direction—i.e., either HHV or VHV, depending on the requirements at the chip level. If a stronger rail is needed, a design using the taller architecture of FIGS. 6 and 7 can either add an M1 rail, or widen the M2 rail by 1 or two tracks, or do a combination of both. Similarly, the shorter architecture of FIGS. 4 and 5 also supports widening the M2 rail from 1 to 2 tracks.

The new cell rail architecture may enable 7 tracks tall cell architectures to use a 1-track rail instead of a 2-track rail. Some experiments indicate that the architecture with a 1-track rail provides up to 15% higher cell row utilization than corresponding architectures that use a 2 tracks wide rail. Taller cell architectures that use a 2 tracks-wide M2 rail sandwiched with an M1 rail, rather than a 3 tracks-wide M2 rail, offer up to 10% higher cell row utilization. Further, the sandwich rails may eliminate the catastrophic failures possible in M2-only rails, when vias in such cell rails fail.

The power rail formed in the metal layers may be used for cell level power connections or chip level global power connections. Example, metal layers used could be M1 and M2. The power rail formed in the metal layers described above may also be used for chip level global power connections. Example, metal layers used for cell level power connections could be M1 and M2. The higher metal layers may used for global chip level wire nets, such as M5 and M6.

Note, in an embodiment, a power rail may be formed by more than two wires on the same metal rail. A first wire, second wire and third wire may form a subset of the total number of wires on a particular metal layer used to form the power rail. The third wire is adjacent to and run in parallel on the same metal layer as a first and second wire may be used to form the upper portion of a power rail. The vias, which connect down to the lower metal layer or to the silicon, are approximately centered between wires forming the upper portion of the power rail.

In an embodiment, either the wire in a lower metal layer or the wire in the upper metal layer is not physically run in a fabricated integrated circuit. In this sandwich rail situation, either the M1 or the M2 rail, (but not both) may be optional. This is also a case of programmability of rail width. If the M1 rail is eliminated, the standard cell architecture is compatible with both HHVH style metal routing directions as well as VHVH style metal routing directions for global interconnects. If the M2 rail is eliminated, the standard cell architecture is compatible with both HHVH as well as HVHV style metal routing directions for global interconnects.

Figure 8:
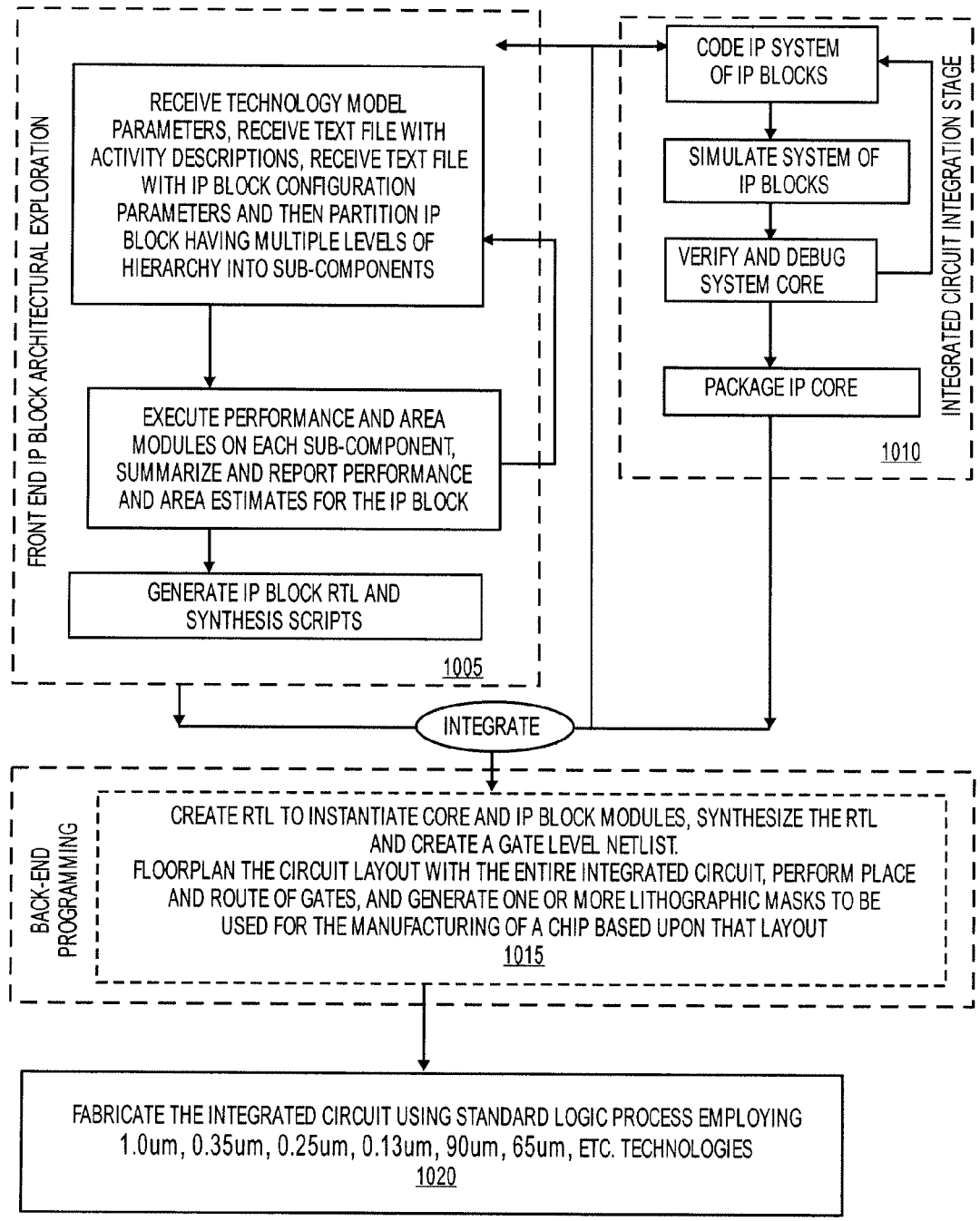
FIG. 8 is a flow diagram of an example process for generating an integrated circuit device.

FIG. 8 illustrates a flow diagram of an example process for generating a device, such as a System on a Chip, with the power rail structures described above. The example process may utilize an electronic circuit design generator, such as a memory compiler, that is part of an Electronic Design Automation (EDA) toolset. The information representing the apparatuses and/or methods may be contained in an instance of a cell library, soft instructions in an electronic circuit design generator such as a complier, or similar machine-readable storage medium storing this information. The information representing the apparatuses and/or methods stored on the machine-readable storage medium may be used in the process of creating the apparatuses and/or methods described above.

Aspects of the above design may be part of a software library containing, for example, a set of one track wide and two track wide power rails. The power rail Libraries are developed in accordance with industry standards and support a wide range of power needs and to adhere to not violate wire and via placement on routing tracks. The power rail Libraries may be suited for 0.13 µm, 90 nm, 45 nm and even smaller gate length designs where ESD is an increasingly difficult problem to deal with.

The electronic circuit design generator may be used for making a highly configurable, scalable System On a Chip (SOC) input output (I-O) system that integrally manages input and output data, control, debug and test flows, as well as other applications. In an embodiment, an example electronic circuit design generator may comprise the following: a graphic user interface; a common set of processing elements; and a library of files containing design elements such as circuits, control logic, and cell arrays. Traditionally, there exist two major stages of SOC design: front-end processing and back-end programming. Front-end processing comprises the design and architecture stages, which includes design of the SOC schematic. The front-end processing may include connecting models, configuration of the design, simulating and tuning during the architectural exploration. The design is typically simulated and tested. Front-end processing traditionally includes simulation of the circuits within the SOC and verification that they should work correctly. The integration of the electronic circuit design may include packing the cores, verifying the cores, simulation and debugging. The tested and verified components then may be stored as part of a library.

Back-end programming traditionally includes programming of the physical layout of the SOC such as placing and routing, or floor planning, of the circuit elements on the chip layout, as well as the routing of all interconnects between components. Thus, the floor plan may be generated imported and edited. After this, the design may be outputted into a Netlist of one or more hardware design languages (HDL) such as Verilog, VHDL (Very-High-Speed Integrated Circuit Hardware Description Language) or SPICE (Simulation Program for Integrated Circuit Emphasis). A Netlist describes the attributes of each component and the interconnectivity amongst the components. After the Netlist is generated, synthesizing of the design with Register Transfer Level (RTL) may occur. Back-end programming further includes the physical verification of the layout to verify that it is physically manufacturable and the resulting SOC will not have any function-preventing physical defects. While front-end views support documentation, simulation, debugging, and testing, the back-end files, such as a layout, physical Library Exchange Format (LEF), etc are for layout and fabrication.

In block 1005, the designs for laying tracks making up the power rails may be supplied to the electronic circuit design generator. As discussed, the electronic circuit design generator may be a software program comprised of multiple algorithms and designs for the purpose of generating a circuit design and a layout in a space available on a target chip. The set of application-specific algorithms and interfaces of the electronic circuit design generator may be used by system integrated circuit (IC) integrators to rapidly create a signal generation circuit suitable for the specific application. In an embodiment, this may involve supplying the circuit netlist and layout fitted in a space on the chip. The wire and via placement are placed on the chip with respect to each and on the routing tracks such that they do not violate design spacing rules as described above.

The electronic circuit design generator may include object code in a set of executable software programs. The library of files containing design elements may be a stand alone program by itself. The electronic circuit generator provides timing diagrams, power and area aspects of each component, models coded to represent the components in order to run actual operation and configuration simulations. The electronic circuit design generator may generate a netlist and a layout targeted to fit in the space available on a target chip. Typically, the electronic circuit design generator will store the data representing the power rail structures on a machine-readable storage medium. The electronic circuit design generator then may provide the device layout (including the power rails) to be used to generate one or more lithographic masks utilized in the fabrication of the device including the power rails. The electronic circuit design generator may also provide a netlist for verification of the device and the power rails.

In block 1010, the electronic circuit design generator may provide designs to simulate and verify the operation of the I-O circuits. The machine may also generate simulations of software representations of the circuits described above that can be functionally tested, timing tested, debugged and validated.

In block 1015, the generated device layout may be integrated with the rest of the layout for the chip. Also, the machine may generate representations of the circuits described above for simulations, one or more lithographic masks for transferring the circuit design onto the chip during manufacture, or other similar useful derivations of the circuits described above.

In block 1020, a fabrication facility may fabricate one or more chips utilizing the lithographic masks generated from the electronic circuit design generator's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, 65 nm or less, to fabricate the chips. The size of the CMOS logic process employed typically defines the smallest minimum lithographic dimension that can be fabricated on the chip using the lithographic masks, which in turn, determines minimum component size. In one embodiment, the electronic circuit design generator is designed for embedded applications in a standard CMOS logic process.

In one embodiment, an electronic circuit design generator may be implemented in software as a set of data and instructions, such as a software cell library callable to other programs, or as an executable program with the software cell library in one program, stored on a machine-readable medium. A machine-readable storage medium may include any mechanism that provides (e.g., stores and/or transmits) information in a form readable by a machine (e.g., a computer). For example, a machine-readable medium may include, but is not limited to: read only memory (ROM); random access memory (RAM); magnetic disk storage media; optical storage media; flash memory devices; DVD's; electrical, optical, acoustical or other forms of propagated signals (e.g., carrier waves, infrared signals, digital signals); EPROMs; EEPROMs; FLASH, magnetic or optical cards; or any other type of media suitable for storing electronic instructions.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

While some specific embodiments of the invention have been shown the invention is not to be limited to these embodiments. For example, most functions performed by electronic hardware components may be duplicated by software emulation. Thus, a software program written to accomplish those same functions may emulate the functionality of the hardware components in input-output circuitry. The cell-based architecture implementing the sandwich rail may include standard cells, metal programmable cells built upon a design fabric, gate array cells built upon a design fabric, and other similar cells. Also, other metal layers and different amounts of track widths may be possible. For example, references made above to M2 and M1 used at the cell level could instead be to other pairs of upper and lower layers at the chip level, such as M5 and M6, or M3 and an upper layer. The invention is to be understood as not limited by the specific embodiments described herein, but only by scope of the appended claims.

What is claimed is:

1. A machine-readable medium having data and instructions stored thereon, which, when executed by a machine, cause the machine to:
   generate a representation of an integrated circuit implementing a cell based architecture comprising a power rail formed of:
      a first wire in a first metal layer and a second wire in second metal layer of the integrated circuit above the first metal layer, wherein the first and second wires extend in a same direction; and
      a plurality of vias spaced at periodic intervals connecting the first and second wires; and
   store the representation.

2. A method for routing a power rail of an integrated circuit design, comprising:
   placing a first wire in a first metal layer of the integrated circuit design;
   placing a second wire in a second metal layer of the integrated circuit design above the first metal layer, wherein the first and second wires extend in a same direction;
   placing a plurality of vias spaced at regular intervals between each via in the plurality of vias to connect the first and second wires, wherein the first wire, second wire, and vias are configured as the power rail.

3. The method of claim 2, wherein the power rail is for a standard cell in the integrated circuit design.

4. The method of claim 3, wherein the second wire in the second metal layer has a width that occupies an odd number of a plurality routing tracks that are parallel to the second wire, a top boundary of the standard cell lines up with a first routing track of the plurality of routing tracks and the bottom boundary lines up with a second routing track of the plurality of routing tracks.

5. The method of claim 3, wherein the second wire in the second metal layer has a width that occupies an even number of a plurality of routing tracks that are parallel to the second wire, a top boundary of the standard cell is offset by a half track relative to a first routing track of the plurality of routing tracks and the bottom boundary of the standard cell is offset by a half track relative to a second routing track of the plurality of routing tracks.

6. A machine-readable medium having data and instructions stored thereon, which, when executed by a machine, cause the machine to
   place a first wire in a first metal layer of an integrated circuit design;
   place a second wire in a second metal layer of the integrated circuit design above the first metal layer, wherein the first and second wires extend in a same direction;
   place a plurality of vias spaced at regular intervals between each via in the plurality of vias to connect the first and second wires, wherein the first wire, second wire, and vias are configured as the power rail.

7. The method of claim 2, wherein the plurality of vias are at least one grid away from left and right cell boundaries, and the power rail is formed in metal layers used for chip level global power connections.

8. The method of claim 2, wherein successive ones of the plurality of vias are spaced at least three grids apart in a direction of the first and second wires, and the vias between the first and second routing layers are offset between routing tracks that are orthogonal to a direction of the first and second wires.

9. The method of claim 8, wherein each of the plurality of vias is located at a point half way between routing tracks that are orthogonal to the direction of the first and second wires and the integrated circuit is a System on a Chip.

10. A machine readable medium having data and instructions stored therein which, when executed by a machine, cause the machine to:
   generate a standard cell layout for an insulated gate field effect transistor integrated circuit manufacturing process in which an effective gate length is less than 100 nanometers,
   wherein the standard cell layout has a power rail, running along a cell boundary, that is formed of a first wire in a first metal layer and a second wire in a second metal layer above the first metal layer, the first and second wires extending in a same direction and connected by a plurality of vias spaced at regular intervals; and
   store the standard cell layout.

11. The machine readable medium of claim 10, wherein successive ones of the plurality of vias are spaced three grids apart, and each of the plurality of vias is located midway between a respective pair of adjacent routing tracks that are orthogonal to the direction of the first and second wires.

12. The machine readable medium of claim 10, wherein the standard cell layout is part of an integrated circuit design architecture and the vias are spaced to not violate design rules for the architecture in which the following layout is a violation of the design rules for the architecture:
   a given via centered on a track that runs in a first direction;
   first and second neighboring vias each centered on said track, at a minimum-via-spacing relative to the given via and on opposite sides of the given via; and
   a third neighboring via centered on an adjacent track that runs in the first direction, the third neighboring via being aligned with the given via in a second direction that is orthogonal to the first direction.

13. The machine readable medium of claim 10, wherein the standard cell layout is part of an integrated circuit design architecture and the vias are spaced to not violate design rules for the architecture in which the following layout is a violation of the design rules for the architecture:

a pair of vias on adjacent grid points, respectively, the adjacent grid points being aligned with each other in a first direction, and wherein the pair of vias connect to a pair of wires, respectively, that run in a second direction which is orthogonal to the first direction.

14. An apparatus comprising:
a first wire in a first metal layer of an integrated circuit;
a second wire in a second metal layer of the integrated circuit above the first metal layer, wherein the first and second wires extend in a same direction; and
a plurality of vias spaced at regular intervals between each via in the plurality of vias to connect the first and second wires,
wherein the first and second wires connected by the plurality of vias is configured to be a power rail.

15. The apparatus of claim 14, wherein the power rail is for a standard cell in the integrated circuit.

16. The apparatus of claim 14, wherein the second wire in the second metal layer has a width that occupies an odd number of a plurality routing tracks that are parallel to the second wire, a top boundary of the standard cell lines up with a first routing track of the plurality of routing tracks and the bottom boundary lines up with a second routing track of the plurality of routing tracks.

17. The apparatus of claim 14, wherein the second wire in the second metal layer has a width that occupies an even number of a plurality of routing tracks that are parallel to the second wire, a top boundary of the standard cell is offset by a half track relative to a first routing track of the plurality of routing tracks and the bottom boundary of the standard cell is offset by a half track relative to a second routing track of the plurality of routing tracks.

18. The apparatus of claim 14, wherein the plurality of vias are at least one grid away from left and right cell boundaries, and the power rail is formed in metal layers used for chip level global power connections.

19. The apparatus of claim 14, wherein successive ones of the plurality of vias are spaced at least three grids apart in a direction of the first and second wires, and the vias offset between routing tracks that are orthogonal to the direction of the first and second wires.

20. The apparatus of claim 14, wherein each of the plurality of vias is located at a point half way between routing tracks that are orthogonal to a direction of the first and second wires and the integrated circuit is a System on a Chip.

* * * * *